US011758751B2

(12) United States Patent
Zhao et al.

(10) Patent No.: US 11,758,751 B2
(45) Date of Patent: Sep. 12, 2023

(54) DISPLAY COMPRISING OLEDS HAVING TRANSPARENT TOP ELECTRODES AND METHOD OF FORMING SAME

(71) Applicant: eMagin Corporation, Hopewell Junction, NY (US)

(72) Inventors: Fangchao Zhao, Hopewell Junction, NY (US); Ilyas I. Khayrullin, Hopewell Junction, NY (US); Chen Dong, Hopewell Junction, NY (US); Amalkumar P. Ghosh, Hopewell Junction, NY (US)

(73) Assignee: EMAGIN CORPORATION, Hopewell Junction, NY (US)

( * ) Notice: Subject to any disclaimer, the term of this patent is extended or adjusted under 35 U.S.C. 154(b) by 187 days.

(21) Appl. No.: 17/347,118

(22) Filed: Jun. 14, 2021

(65) Prior Publication Data

US 2021/0399252 A1 Dec. 23, 2021

Related U.S. Application Data

(60) Provisional application No. 63/042,270, filed on Jun. 22, 2020.

(51) Int. Cl.
*H01L 21/00* (2006.01)
*H10K 50/805* (2023.01)
*H10K 59/121* (2023.01)

(52) U.S. Cl.
CPC ......... *H10K 50/805* (2023.02); *H10K 59/121* (2023.02)

(58) Field of Classification Search
CPC .................................................. H10K 50/805
See application file for complete search history.

(56) References Cited

U.S. PATENT DOCUMENTS

| 5,920,080 | A | 7/1999 | Jones | |
|---|---|---|---|---|
| 6,278,237 | B1 | 8/2001 | Campos | |
| 7,233,026 | B2 | 6/2007 | Liu et al. | |
| 2016/0164046 | A1* | 6/2016 | Uezawa | H10K 71/20 438/34 |
| 2017/0346023 | A1* | 11/2017 | Jankus | H10K 71/60 |
| 2021/0005834 | A1* | 1/2021 | Lee | H10K 50/171 |
| 2021/0005844 | A1* | 1/2021 | Kim | H10K 59/12 |
| 2021/0119162 | A1* | 4/2021 | Gao | H10K 85/653 |
| 2021/0179649 | A1* | 6/2021 | Liou | C07F 15/0033 |
| 2021/0210708 | A1* | 7/2021 | Ganier | H10K 85/30 |

* cited by examiner

*Primary Examiner* — Douglas M Menz
(74) *Attorney, Agent, or Firm* — KAPLAN BREYER SCHWARZ, LLP

(57) ABSTRACT

Aspects of the present disclosure describe systems, methods, and structures that provide organic light-emitting diodes having high luminous efficiency and low electrical dissipation. Embodiments in accordance with the present disclosure include a top electrode normally comprising a single film that includes a pair of metals and one metal compound, where the metals include a precious metal in combination with an alkaline earth metal or rare-earth metal and the metal compound is an alkali metal compound. As a result, such a top electrode has a work function that is better matched for efficient electron injection than magnesium-silver alloy-based transparent electrodes known in the prior art.

16 Claims, 3 Drawing Sheets

DISPLAY COMPRISING OLEDS HAVING TRANSPARENT TOP ELECTRODES AND METHOD OF FORMING SAME

CROSS REFERENCE TO RELATED APPLICATIONS

This application claims the benefit of U.S. Provisional Application Ser. No. 63/042,270, filed Jun. 22, 2020, entitled "OLED Having a Transparent Top Electrode and Method of Forming Same", which is incorporated herein by reference. If there are any contradictions or inconsistencies in language between this application and one or more of the cases that have been incorporated by reference that might affect the interpretation of the claims in this case, the claims in this case should be interpreted to be consistent with the language in this case.

TECHNICAL FIELD

The present invention relates to display fabrication and, more particularly, to transparent/semitransparent top electrodes for organic light-emitting diode (OLED) display elements, such as pixels or sub-pixels.

BACKGROUND

Organic Light-Emitting Diode (OLED) displays include an array of pixels, each of which typically includes at least one OLED for providing light. Each OLED is formed of a stack of thin layers formed on a substrate. These layers include a light-emitting layer (or multiple sub-layers) of a luminescent organic material and adjacent semiconductor layers, which are collectively sandwiched between a cathode and an anode.

In response to an electrical signal applied to the cathode and anode, the luminescent organic material emits light. In a top-emitting OLED, the top electrode of the OLD stack must be at least partially transparent to enable emitted light to exit the device and form part of an image displayed by the OLED array.

In the prior art, some transparent electrodes are formed of thin-film magnesium-silver (Mg—Ag) alloy. Unfortunately, such OLEDs tend to suffer from poor luminous efficiency due to the low transmittance of this material.

It is well known that luminous efficiency can be improved by increasing the percentage of silver in the Mg—Ag alloy to realize top electrodes of Ag-rich Mg—Ag alloy films. While the use of such Ag-rich alloy films can enhance light extraction, it can increase the voltage required to drive the OLED due to a mismatched work function of Ag for efficient electron injection. As a result, the use of Ag-rich magnesium-silver alloys can significantly increase the power consumption of the OLED.

An OLED having a highly transparent top electrode that also exhibits low power consumption would be a significant advance in the state of the art.

SUMMARY

The present disclosure is directed to OLED-based displays that employ arrays of OLEDs that simultaneously have high luminous efficiency and low power consumption. A top electrode for an OLED in accordance with the present disclosure comprises a single film that includes a pair of metals and one metal compound. In some embodiments, the metals include a precious metal in combination with an alkaline earth metal or rare-earth metal, while the metal compound is an alkali metal compound.

An illustrative embodiment of an OLED in accordance with the present disclosure includes a top electrode having a composite material that includes silver, magnesium, and lithium fluoride, which are co-deposited to form a film having a thickness within the range of approximately 5 nm to approximately 25 nm. In the illustrative embodiment, the materials are co-deposited via evaporation, such as thermal evaporation or e-beam evaporation; however, any suitable co-deposition method can be used without departing from the scope of the present disclosure.

In some embodiments, the precious metal has the highest ratio in the composite layer, the alkaline earth metal (or rare earth metal) has the second highest ratio on the composite layer, and the alkali metal compound has the lowest ratio in the composite layer. In some embodiments, other ratios of the metals and metal compounds are used.

In some embodiments, the top electrode includes a precious metal other than silver, such as gold, platinum, and the like.

In some embodiments, the top electrode includes an alkali earth metal other than magnesium, such as calcium, beryllium, strontium, barium, and radium.

In some embodiments, the top electrode includes rare-earth metal rather than an alkali earth metal. Rare-earth metals suitable for use in accordance with the present disclosure include ytterbium, scandium, lithium, lanthanum, yttrium, cerium, praseodymium, and the like.

In some embodiments, the top electrode includes a metal compound that is an alkali metal compound, such as lithium fluoride (LiF), cesium fluoride (CsF), and the like.

An embodiment in accordance with the present disclosure is a display comprising a plurality of pixels, each pixel including at least one organic light-emitting diode (OLED) that emits light, wherein the at least one OLED comprises a first electrode that is at least partially transparent for the light, and wherein the first electrode includes a first layer of a composite material comprising: a first metal that is a precious metal; a second metal that is either an alkaline earth metal or a rare-earth metal; and a metal compound that is an alkali metal compound; wherein the composite material includes a first ratio of the first metal, a second ratio of the second metal and a third ratio of the metal compound; wherein the first ratio is greater than each of the second ratio and third ratios; and wherein the third ratio is less than each of the first ratio and second ratio.

Another embodiment in accordance with the present disclosure is an organic light-emitting diode (OLED) that emits light, wherein the OLED comprises a first electrode that is at least partially transparent for the light, and wherein the first electrode includes a first layer of a composite material comprising: a first metal that is a precious metal; a second metal that is either an alkaline earth metal or a rare-earth metal; and a metal compound that is an alkali metal compound; wherein the first metal has the highest ratio in the composite material and the metal compound has the lowest ratio in the composite material.

Yet another embodiment in accordance with the present disclosure is a method for forming an organic light-emitting diode (OLED) that emits light, wherein the OLED comprises a first electrode that is at least partially transparent for the light, and wherein the OLED is formed by operation including: providing a material stack on a substrate, the material stack including a light-emitting layer comprising a luminescent organic material; and forming a first layer of a composite material disposed on the light-emitting layer such that the first layer is distal to the substrate, wherein the composite material is formed by co-depositing a first metal, a second metal, and a metal compound; wherein the first metal is a precious metal; wherein the second metal is either an alkaline earth metal or a rare-earth metal; and wherein the metal compound is an alkali metal compound.

DETAILED DESCRIPTION

Figure 1:
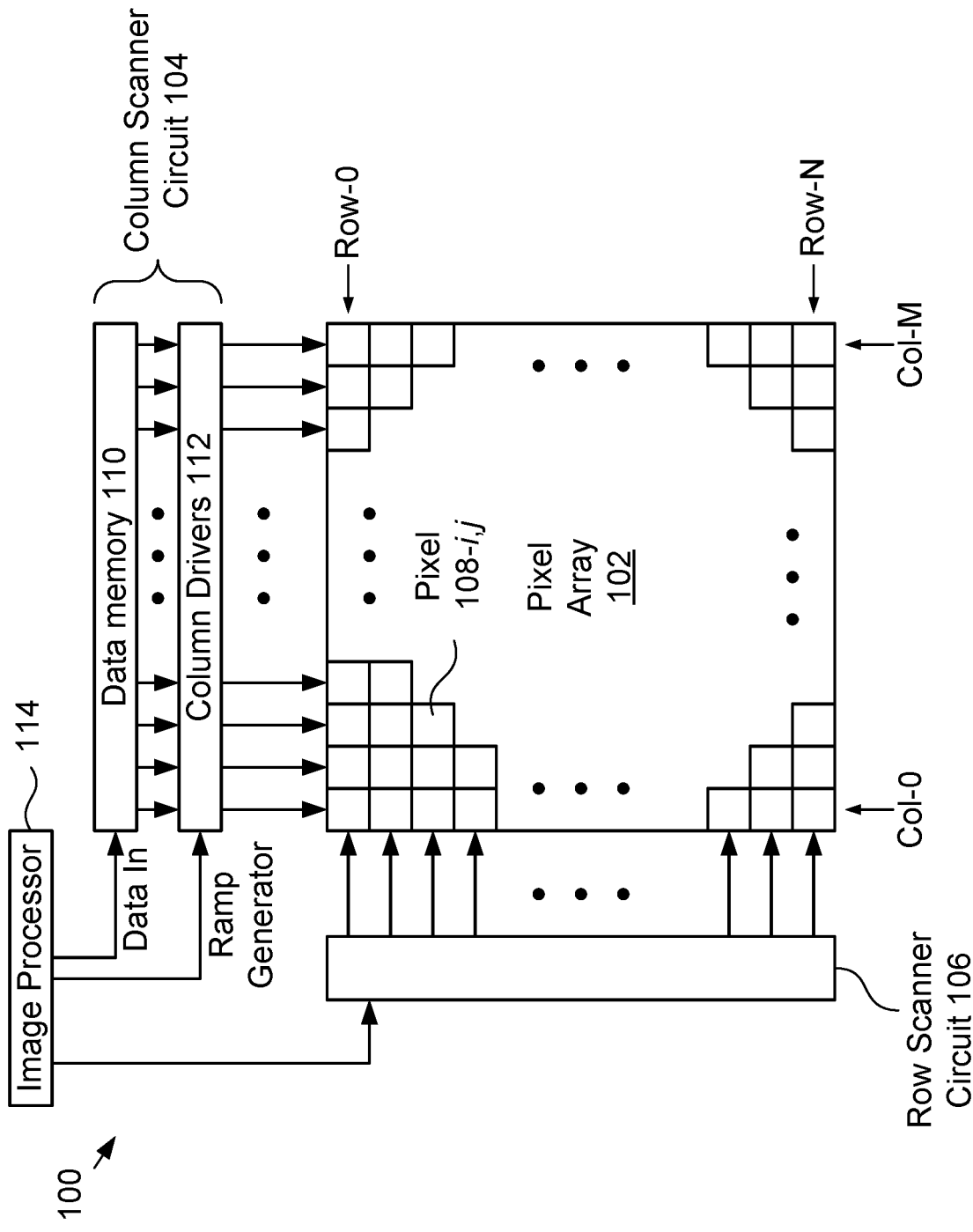
FIG. 1 depicts a schematic drawing of an image-rendering system in accordance with the present disclosure.

The following merely illustrates the principles of the disclosure. It will thus be appreciated that those skilled in the art will be able to devise various arrangements which, although not explicitly described or shown herein, embody the principles of the disclosure and are included within its spirit and scope.

Furthermore, all examples and conditional language recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

The functions of the various elements shown in the Drawing, including any functional blocks that may be labeled as "processors", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules which are implied to be software, may be represented herein as any combination of flowchart elements or other elements indicating performance of process steps and/or textual description. Such modules may be executed by hardware that is expressly or implicitly shown.

Unless otherwise explicitly specified herein, the figures comprising the drawing are not drawn to scale.

Furthermore, for the purposes of this Specification, including the appended claims, "disposed on" (or "formed on") is defined as "exists on" an underlying material or layer. This layer may comprise intermediate layers, such as transitional layers, necessary to ensure a suitable surface. For example, if a material is described to be "disposed (or grown) on a substrate," this can mean that either (1) the material is in intimate contact with the substrate; or (2) the material is in contact with one or more transitional layers that reside on the substrate.

FIG. 1 depicts a schematic drawing of an image-rendering system in accordance with the present disclosure. Display 100 comprises pixel array 102, column scanner circuit 104, and row scanner circuit 106. In the depicted example, display 100 is an organic light-emitting diode (OLED) microdisplay; however, it will be clear to one skilled in the art, after reading this Specification, that the teachings of the present disclosure are applicable to myriad image-rendering systems. Furthermore, the components and their arrangement within display 100 are for exemplary purposes only and should not be viewed as limiting for the types of displays that within the scope of the present disclosure.

Pixel array 102 includes a two-dimensional array of pixels 108 having N rows and M columns, where each of N and M is any practical number. Each of pixels 108 includes an OLED whose light output is based on a data signal provided to it (not shown in FIG. 1) when the pixel is activated, as described below.

Column scanner 104 is conventional column-scanning logic circuit that provides a different drive signal, one at a time, to each column j, where j=1 through M, of pixel array 102. Column scanner 104 includes data memory 110 and column drivers 112, where the data memory includes a plurality of shift registers for storing serial-video data provided by conventional image processor 114. The video data is then converted to voltages and provided to columns CoI-1 through CoI-M by the column drivers.

In similar fashion, row scanner 106 provides a different drive signal, one at a time, to each row i, where i=1 through N, of pixel array 102.

When column scanner circuit 104 drives column j and row scanner circuit 106 drives row i, the OLED of pixel 108-*i*-*j* is enabled and can emit light in response to an applied data signal (i.e., the pixel is activated). It should be noted that, in some embodiments, at least some of pixels 108 include multiple OLEDs, each of which functions as a sub-pixel.

Figure 2:
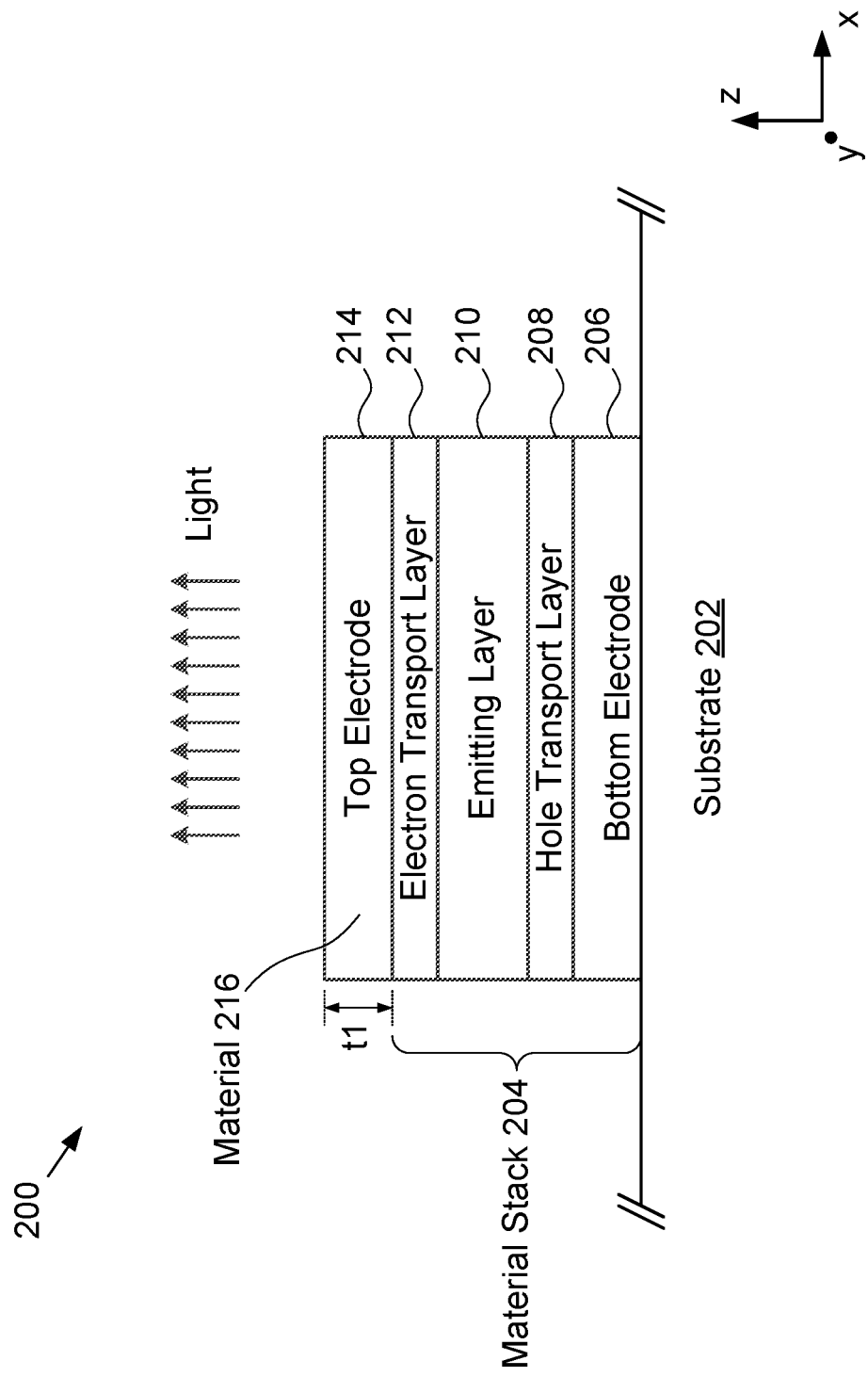
FIG. 2 depicts a schematic drawing of a cross-sectional view of an OLED suitable for use in pixel 108-*i*-*j*.

FIG. 2 depicts a schematic drawing of a cross-sectional view of an OLED suitable for use in pixel 108-*i*-*j*. OLED 200 is disposed on substrate 202 and includes bottom electrode 204, hole transport layer 206, emitting layer 208, electron transport layer 210, and top electrode 212.

Figure 3:
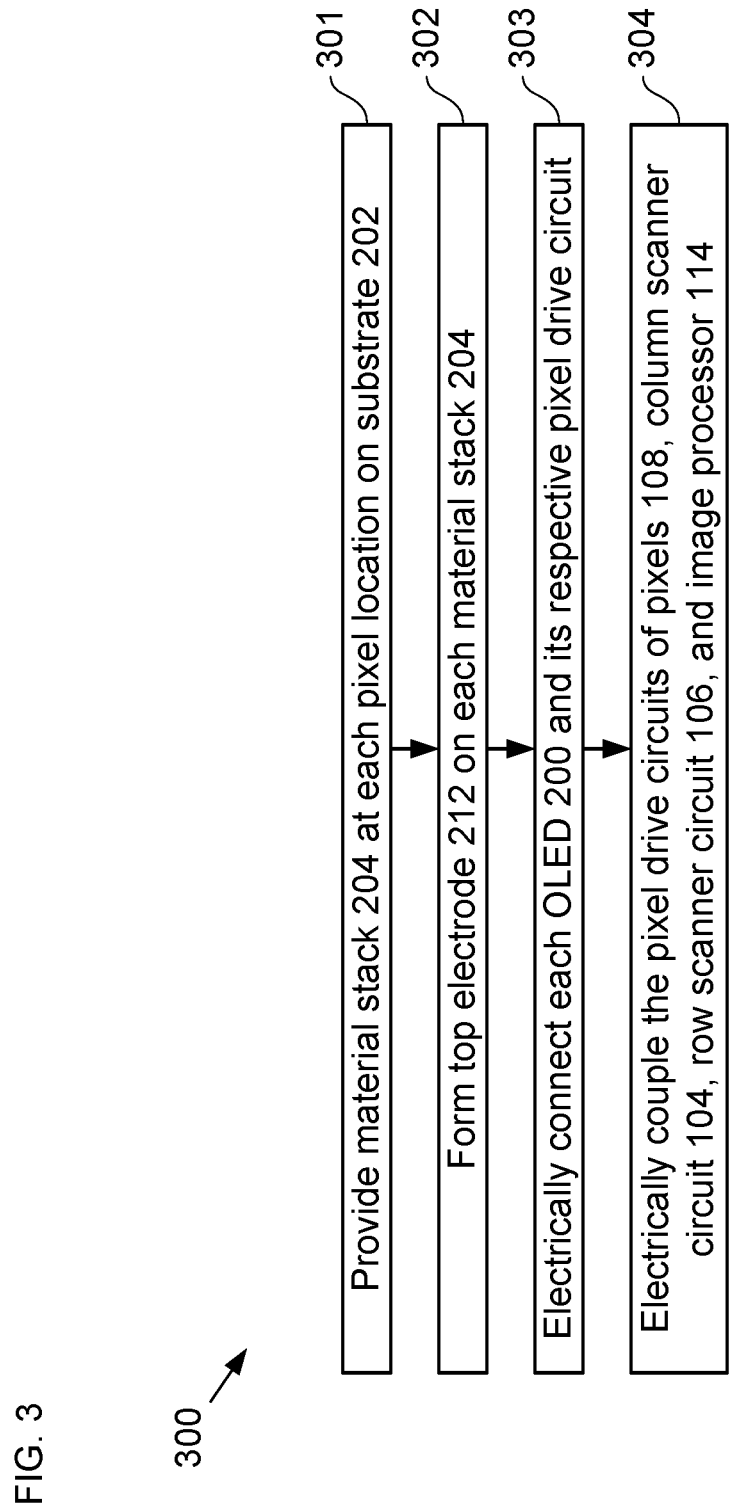
FIG. 3 depicts operations of a method suitable for forming an OLED in accordance with the present disclosure.

FIG. 3 depicts operations of a method suitable for forming an OLED-based display in accordance with the present disclosure. Method 300 begins with operation 301, wherein material stack 204 is provided at each pixel location in display 100. Material stack 204 includes bottom electrode 206, hole transport layer 208, emitting layer 210, and electron transport layer 212. Material stack 204 is an arrangement of layers typically found in a conventional organic light-emitting diode. Suitable OLED structures and layers are described in, for example, U.S. Pat. Nos. 5,920,080, 6,278,237, and 7,233,026, each of which is incorporated herein by reference. It should be noted, however, that any suitable conventional OLED layer structure can be used in OLED 200 without departing from the scope of the present disclosure.

At operation 302, top electrode 212 is formed on material stack 204. Top electrode 212 is a substantially transparent, electrically conductive layer having high luminous efficiency and low electrical power consumption, which affords embodiments in accordance with the present disclosure significant advantages over OLEDs and OLED-based displays known in the prior art, including:
  i. lower power consumption; or
  ii. enhanced color quality; or
  iii. improved lifetime; or
  iv. improved efficiency; or
  v. improved uniformity; or
  vi. any combination of i, ii, iii, iv, and v.

Top electrode 212 is a layer of material 214 having thickness t1, where material 214 is formed by co-deposition of a precious metal, an alkaline earth metal or rare-earth metal, and an alkali metal compound. Typically, t1 is within the range of approximately 5 nm to approximately 25 nm; however, any practical thickness, t1, can be used for top electrode 212. In the depicted example, the materials are co-deposited via evaporation, such as thermal evaporation or e-beam evaporation; however, any suitable co-deposition method can be used without departing from the scope of the present disclosure.

In some embodiments, the precious metal has the highest ratio in the composite layer, the alkaline earth metal (or rare earth metal) has the second highest ratio in the composite layer, and the alkali metal compound has the lowest ratio in the composite layer. In some embodiments, other ratios of the metals and metal compounds are used.

In the depicted example, material 214 is formed by co-evaporating silver, magnesium, and lithium fluoride.

Other precious metals suitable for use in material 214 include, without limitation, gold, platinum, iridium, rhenium, ruthenium, rhodium, palladium, and osmium.

Other alkaline earth metals suitable for use in material 214 include, without limitation, beryllium, magnesium, calcium, strontium, barium, and radium.

Rare-earth metals suitable for use in place of the alkaline earth metal in material 214 include, without limitation, lanthanum, cerium, praseodymium, neodymium, promethium, samarium, europium, gadolinium, terbium, dysprosium, holmium, erbium, thulium, ytterbium, lutetium, scandium, and yttrium.

Other alkali metal compounds suitable for use in material 214 include cesium fluoride, and the like.

At operation 303, each OLED 200 is electrically connected to the pixel drive circuit of its respective pixel 108.

At operation 304, column scanner circuit 104, row scanner circuit 106, and image processor 114 are electrically coupled with the pixel drive circuits of pixels 108.

It is to be understood that the disclosure teaches some examples of the illustrative embodiment and that many variations of the invention can easily be devised by those skilled in the art after reading this disclosure.

The invention claimed is:

1. A display comprising a plurality of pixels, each pixel including at least one organic light-emitting diode (OLED) that emits light, wherein the at least one OLED comprises a first electrode that is at least partially transparent for the light, and wherein the first electrode includes a first layer of a composite material comprising:
  a first metal that is a precious metal;
  a second metal that is either an alkaline earth metal or a rare-earth metal; and
  a metal compound that is an alkali metal compound;
    wherein the composite material includes a first ratio of the first metal, a second ratio of the second metal and a third ratio of the metal compound;
    wherein the first ratio is greater than each of the second ratio and third ratios; and
    wherein the third ratio is less than each of the first ratio and second ratio.

2. The display of claim 1 wherein the at least one OLED is disposed on a substrate and the first electrode is distal to the substrate.

3. The display of claim 1 wherein the first metal is silver, gold, or platinum.

4. The display of claim 1 wherein second metal is magnesium or calcium.

5. The display of claim 1 wherein second metal is ytterbium, cerium, lithium, or yttrium.

6. The display of claim 1 wherein metal compound is lithium fluoride or cesium fluoride.

7. The display of claim 1 wherein first metal is silver, the second metal is magnesium, and the metal compound is lithium fluoride.

8. The display of claim 1 wherein first metal is silver, the second metal is ytterbium, and the metal compound is lithium fluoride.

9. An organic light-emitting diode (OLED) that emits light, wherein the OLED comprises a first electrode that is at least partially transparent for the light, and wherein the first electrode includes a first layer of a composite material comprising:
  a first metal that is a precious metal;
  a second metal that is either an alkaline earth metal or a rare-earth metal; and
  a metal compound that is an alkali metal compound;
    wherein the first metal has the highest ratio in the composite material and the metal compound has the lowest ratio in the composite material.

10. The OLED of claim 9 wherein the OLED is disposed on a substrate and the first electrode is distal to the substrate.

11. The display of claim 9 wherein the first metal is silver, gold, or platinum.

12. The display of claim 9 wherein second metal is magnesium or calcium.

13. The display of claim 9 wherein second metal is ytterbium, cerium, lithium, or yttrium.

14. The display of claim 9 wherein metal compound is lithium fluoride or cesium fluoride.

15. The display of claim 9 wherein first metal is silver, the second metal is magnesium, and the metal compound is lithium fluoride.

16. The display of claim 9 wherein first metal is silver, the second metal is ytterbium, and the metal compound is lithium fluoride.

* * * * *